(12) United States Patent
Radosavljevic et al.

(10) Patent No.: US 7,279,375 B2
(45) Date of Patent: Oct. 9, 2007

(54) BLOCK CONTACT ARCHITECTURES FOR NANOSCALE CHANNEL TRANSISTORS

(75) Inventors: Marko Radosavljevic, Beaverton, OR (US); Amlan Majumdar, Portland, OR (US); Brian S. Doyle, Portland, OR (US); Jack Kavalieros, Portland, OR (US); Mark L. Doczy, Beaverton, OR (US); Justin K. Brask, Portland, OR (US); Uday Shah, Portland, OR (US); Suman Datta, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 11/173,866

(22) Filed: Jun. 30, 2005

(65) Prior Publication Data
US 2007/0001219 A1    Jan. 4, 2007

(51) Int. Cl.
H01L 21/336    (2006.01)
(52) U.S. Cl. .................................. 438/197; 438/283
(58) Field of Classification Search ............... 438/197, 438/151, 156, 157
See application file for complete search history.

(56) References Cited

U.S. PATENT DOCUMENTS

| | | |
|---|---|---|
| 4,906,589 A | 3/1990 | Chao |
| 5,124,777 A | 6/1992 | Lee |
| 5,338,959 A | 8/1994 | Kim et al. |
| 5,346,839 A | 9/1994 | Sundaresan |
| 5,391,506 A * | 2/1995 | Tada et al. ................. 438/268 |
| 5,466,621 A | 11/1995 | Hisamoto et al. |
| 5,545,586 A | 8/1996 | Koh |
| 5,563,077 A | 10/1996 | Ha |
| 5,578,513 A | 11/1996 | Maegawa |
| 5,658,806 A | 8/1997 | Lin et al. |
| 5,701,016 A | 12/1997 | Burroughs et al. |
| 5,716,879 A | 2/1998 | Choi et al. |
| 5,793,088 A | 8/1998 | Choi et al. |
| 5,827,769 A | 10/1998 | Aminzadeh et al. |
| 5,888,309 A | 3/1999 | Yu |
| 5,905,285 A | 5/1999 | Gardner et al. |
| 6,163,053 A | 12/2000 | Kawashima |
| 6,252,284 B1 | 6/2001 | Muller et al. |

(Continued)

FOREIGN PATENT DOCUMENTS

EP    0 623 963 A1    11/1994

(Continued)

OTHER PUBLICATIONS

V. Subramanian et al., "A Bulk-Si-Compatible Ultrathin-body SOI Technology for Sub-100m MOSFETS" Proceeding of the 57th Annual Device Research Conference, pp. 28-29 (1999).

(Continued)

*Primary Examiner*—Tuan H. Nguyen
(74) *Attorney, Agent, or Firm*—Blakely, Sokoloff, Taylor & Zafman LLP (57) ABSTRACT

A contact architecture for nanoscale channel devices having contact structures coupling to and extending between source or drain regions of a device having a plurality of parallel semiconductor bodies. The contact structures being able to contact parallel semiconductor bodies having sub-lithographic pitch.

12 Claims, 8 Drawing Sheets

U.S. PATENT DOCUMENTS

| | | | |
|---|---|---|---|
| 6,307,235 B1 | 10/2001 | Forbes et al. | |
| 6,376,317 B1 | 4/2002 | Forbes et al. | |
| 6,383,882 B1 | 5/2002 | Lee et al. | |
| 6,396,108 B1 | 5/2002 | Krivokapic et al. | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,457,890 B1 | 11/2002 | Yu | |
| 6,475,869 B1 | 11/2002 | Yu | |
| 6,475,890 B1 | 11/2002 | Yu | |
| 6,483,156 B1 | 11/2002 | Adkisson et al. | |
| 6,525,403 B2 | 2/2003 | Inaba et al. | |
| 6,562,665 B1 | 5/2003 | Yu | |
| 6,611,029 B1 | 8/2003 | Ahmed et al. | |
| 6,635,909 B2 | 10/2003 | Clark et al. | |
| 6,645,797 B1 | 11/2003 | Buynoski et al. | |
| 6,680,240 B1 | 1/2004 | Maszara | |
| 6,706,571 B1 | 3/2004 | Yu et al. | |
| 6,709,982 B1 | 3/2004 | Buynoski et al. | |
| 6,713,396 B2 | 3/2004 | Anthony | |
| 6,716,684 B1 | 4/2004 | Krivokapic et al. | |
| 6,716,686 B1* | 4/2004 | Buynoski et al. | 438/157 |
| 6,716,690 B1 | 4/2004 | Wang et al. | |
| 6,730,964 B2 | 5/2004 | Horiuchi | |
| 6,756,657 B1 | 6/2004 | Zhang et al. | |
| 6,764,884 B1 | 7/2004 | Yu et al. | |
| 6,790,733 B1 | 9/2004 | Natzle et al. | |
| 6,794,313 B1 | 9/2004 | Chang | |
| 6,835,618 B1 | 12/2004 | Dakshina-Murthy | |
| 6,858,478 B2 | 2/2005 | Chau et al. | |
| 6,884,154 B2 | 4/2005 | Mizushima et al. | |
| 6,906,151 B2* | 6/2005 | Hareland et al. | 257/369 |
| 6,921,982 B2 | 7/2005 | Joshi et al. | |
| 7,105,894 B2* | 9/2006 | Yeo et al. | 257/347 |
| 2002/0011612 A1 | 1/2002 | Hieda | |
| 2002/0036290 A1 | 3/2002 | Inaba et al. | |
| 2002/0081794 A1 | 6/2002 | Ito | |
| 2002/0166838 A1 | 11/2002 | Nagarajan | |
| 2002/0167007 A1 | 11/2002 | Yamazaki et al. | |
| 2003/0057486 A1 | 3/2003 | Gambino | |
| 2003/0085194 A1 | 5/2003 | Hopkins, Jr. | |
| 2003/0098488 A1 | 5/2003 | O'Keeffe et al. | |
| 2003/0102497 A1 | 6/2003 | Fried et al. | |
| 2003/0111686 A1 | 6/2003 | Nowak | |
| 2003/0122186 A1 | 7/2003 | Sekigawa et al. | |
| 2003/0143791 A1 | 7/2003 | Cheong et al. | |
| 2003/0151077 A1 | 8/2003 | Mathew et al. | |
| 2003/0201458 A1 | 10/2003 | Clark et al. | |
| 2003/0227036 A1 | 12/2003 | Sugiyama et al. | |
| 2004/0031979 A1 | 2/2004 | Lochtefeld et al. | |
| 2004/0036118 A1 | 2/2004 | Adadeer et al. | |
| 2004/0036127 A1 | 2/2004 | Chau et al. | |
| 2004/0070020 A1 | 4/2004 | Fujiwara et al. | |
| 2004/0092062 A1 | 5/2004 | Ahmed et al. | |
| 2004/0092067 A1 | 5/2004 | Hanafi et al. | |
| 2004/0094807 A1 | 5/2004 | Chau et al. | |
| 2004/0110097 A1 | 6/2004 | Ahmed et al. | |
| 2004/0119100 A1 | 6/2004 | Nowak et al. | |
| 2004/0126975 A1 | 7/2004 | Ahmed et al. | |
| 2004/0166642 A1 | 8/2004 | Chen et al. | |
| 2004/0180491 A1 | 9/2004 | Arai et al. | |
| 2004/0191980 A1 | 9/2004 | Rios et al. | |
| 2004/0195624 A1 | 10/2004 | Liu et al. | |
| 2004/0198003 A1 | 10/2004 | Yeo et al. | |
| 2004/0219780 A1 | 11/2004 | Ohuchi | |
| 2004/0227187 A1 | 11/2004 | Cheng et al. | |
| 2004/0238887 A1* | 12/2004 | Nihey | 257/347 |
| 2004/0256647 A1 | 12/2004 | Lee et al. | |
| 2004/0262683 A1 | 12/2004 | Nihey | |
| 2004/0262699 A1 | 12/2004 | Rios et al. | |
| 2005/0035415 A1 | 2/2005 | Yeo et al. | |
| 2005/0118790 A1 | 6/2005 | Lee et al. | |
| 2005/0127362 A1 | 6/2005 | Zhang et al. | |
| 2005/0145941 A1 | 7/2005 | Bedell et al. | |
| 2005/0156171 A1 | 7/2005 | Brask et al. | |
| 2005/0224797 A1 | 10/2005 | Ko et al. | |
| 2005/0224800 A1 | 10/2005 | Lindert | |
| 2006/0014338 A1* | 1/2006 | Doris et al. | 438/197 |

FOREIGN PATENT DOCUMENTS

| | | |
|---|---|---|
| EP | 1 202 335 A2 | 5/2002 |
| EP | 1 566 844 A2 | 8/2005 |
| JP | 06177089 | 6/1994 |
| JP | 2003-298051 | 10/2003 |
| WO | WO 02/43151 A | 5/2002 |
| WO | WO 2004/059726 A1 | 7/2004 |

OTHER PUBLICATIONS

Hisamoto et al., "A Folded-channel MOSFET for Deepsub-tenth Micron Era", 1998 IEEE International Electron Device Meeting Technical Digest, pp. 1032-1034 (1998).

Huang et al., "Sub 50-nm FinFET: PMOS", 1999 IEEE International Electron Device Meeting Technical Digest, pp. 67-70 (1999).

Auth et al., "Vertical, Fully-Depleted, Surroundings Gate MOSFETS On sub-0.1um Thick Silicon Pillars", 1996 54th Annual Device Research Conference Digest, pp. 108-109 (1996).

Hisamoto et al., "A Fully Depleted Lean-Channel Transistor (DELTA)—A Novel Vertical Ultrathin SOI MOSFET", IEEE Electron Device Letters, V. 11(1), pp. 36-38 (1990).

Jong-Tae Park et al., "Pi-Gate SOI MOSFET" IEEE Electron Device Letters, vol. 22, No. 8, Aug. 2001, pp. 405-406.

Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.

International Search Report PCT/US 03/26242, 2004.

International Search Report PCT/US 03/39727, 2004.

International Search Report PCT/US 03/40320, 2004.

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

A. Burenkov et al., "Corner Effect in Double and Tripe Gate FinFets", IEEE 2003, pp. 135-138.

S.T. Chang et al., "3-D Simulation of Strained Si/SiGe Heterojunction FinFETs", pp. 176-177, 2003.

International Search Report PCT/US2005/010505, 2005.

International Search Report PCT/US2005/020339, 2005.

International Search Report PCT/US2005/000947 (7pages).

Jing Guo, et al. "Performance Projections for Ballistic Carbon Nanotube Field-Effect Transistors", Applied Physics Letters, vol. 80, No. 17, pp. 3192-3194 (Apr. 29, 2004).

Ali Javey, et al., "High-K Dielectrics for Advanced Carbon-Nanotube Transistors and Logic Gates", Advance Online Publication, Published online, pp. 1-6 (Nov. 17, 2002).

Richard Martel, et al., "Carbon Nanotube Field Effect Transistors for Logic Applications" IBM, T.J. Watson Research Center, 2001 IEEE, IEDM 01, pp. 159-162.

David M. Fried, et al., "High-Performance P-Type Independent-Gate FinFETs, IEEE Electron Device Letters", vol. 25, No. 4, Apr. 2004, pp. 199-201.

David M. Fried, et al., "Improved Independent Gate N-Type FinFET Fabrication and Characterization", IEEE Electron Device Letters, vol. 24, No. 9, Sep. 2003, pp. 592-594.

Charles Kuo, et al. "A Capacitorless Double Gate DRAM Technology for Sub-100-nm Embedded and Stand-Alone Memory Applications", IEEE Transactions on Electron Devices, vol. 50, No. 12, Dec. 2003, pp. 2408-2416.

Charles Kuo, et al., "A Capacitorless Double-Gate DRAM Cell Design for High Density Applications", 2002 IEEE International Electron Devices Meeting Technical Digest, Dec. 2002, pp. 843-846.

Takashi Ohsawa, et al., "Memory Design Using a One-Transistor Gain Cell on SOI", IEEE Journal of Solid-State Circuits, vol. 37, No. 11. Nov. 2002, pp. 1510-1522.

T. Tanaka, et al., "Scalability Study on a Capacitorless 1T-DRAM: From Single-Gate PD-SOI to Double-Gate FinDRAM", 2004 IEEE International Electron Devices Meeting Technical Digest, Dec. 2004, 4 pages.

T. M. Mayer, et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

International Search Report PCT/US2005/033439, mailed Jan. 31, 2006 (7 pgs.).

International Search Report PCT/US2005/035380, mailed Feb. 13, 2006 (14 pgs.).

International Search Report PCT/US2005/037169, mailed Feb. 23, 2006 (11 pgs.).

Sung Min Kim, et al., A Novel Multi-channel Field Effect Transistor (McFET) on Bulk Si for High Performance Sub-80nm Application, IEDM 04-639, 2004 IEEE, pp. 27.4.1-27.4.4.

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire FinFET" 2004 Symposium on VLSI Technology Digest of Technical Papers, 2004 IEEE, pp. 196-197.

B. Jin et al., "Mobility Enhancement in Compressively Strained SiGe Surface Channel PMOS Transitors with Hf02/TiN Gate Stack", Proceedings of the First Joint International Symposium, 206th Meeting of Electrochemical Society, Oct. 2004, pp. 111-122.

R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).

International Search Report PCT/US2005/000947 (7pages), 2005.

* cited by examiner

BLOCK CONTACT ARCHITECTURES FOR NANOSCALE CHANNEL TRANSISTORS

BACKGROUND OF THE INVENTION

1. Field of the Invention

The present invention relates to the field of semiconductor integrated circuit manufacturing, and more particularly to contact structures for nanoscale channel devices.

2. Discussion of Related Art

Advances in semiconductor devices and the ongoing quest for miniaturization of the semiconductor devices lead to a demand for better fabrication processes for ever smaller structures because smaller devices typically equate to faster switching times, which lead to increased performance.

Figure 1:
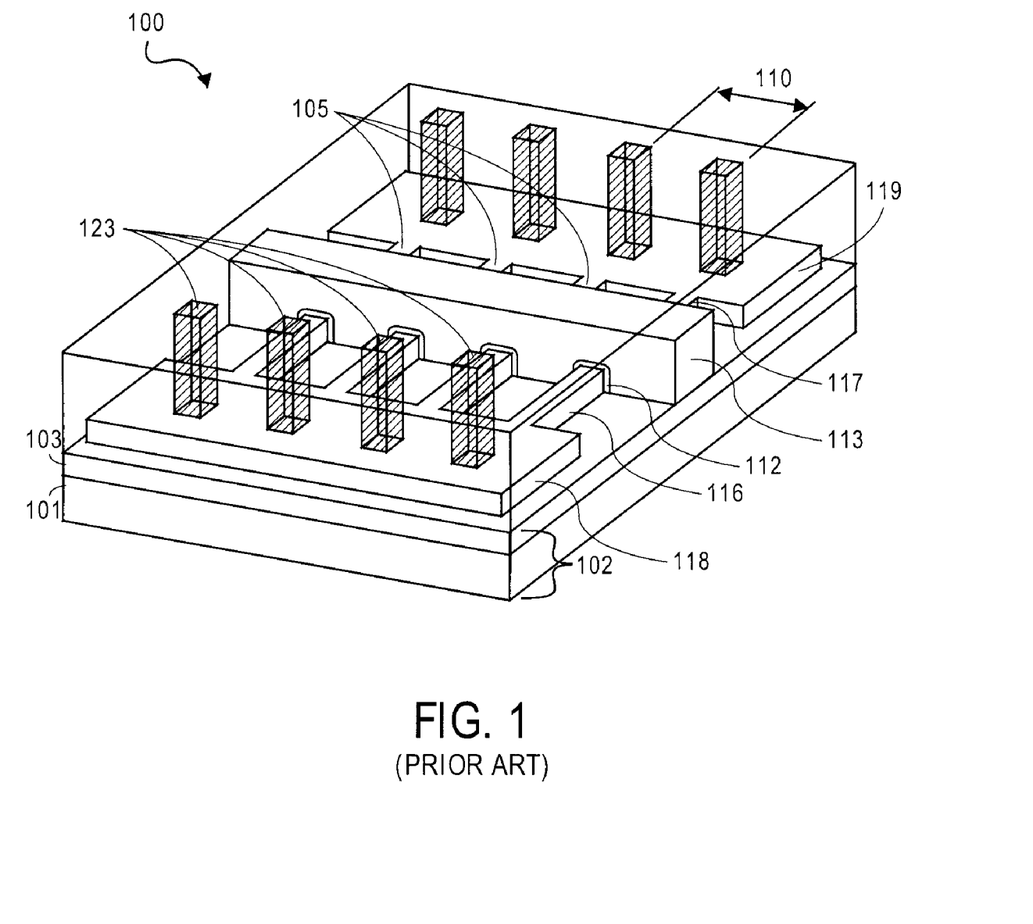
FIG. 1 is an illustration of a perspective view of a conventional multi-channel non-planar transistor.

In order to achieve this increased device performance, smaller device channel lengths are required and so many non-planar device configurations such as dual-gate, FinFET, tri-gate and omega-gate on both bulk silicon substrates and silicon on insulator (SOI) substrates have been proposed. To fabricate nanoscale transistors having an arbitrarily large drive current, device architecture can include an additional or multiple semiconductor bodies or fingers, creating multiple parallel channels. FIG. 1 is a perspective illustration of a multi-channel tri-gate transistor on silicon on insulator 102. A multi-channel transistor 100 includes a single crystalline silicon substrate 101 having an insulating layer 103, such as a buried oxide formed thereon. On the insulating layer, multiple semiconductor bodies or fingers 105 are formed as shown in FIG. 1. A gate dielectric layer 112 is formed on the multiple semiconductor bodies 105 and a gate electrode 113 formed on the gate dielectric 112, strapping across the multiple semiconductor bodies 105. Source 116 and drain 117 regions are formed in the single crystalline semiconductor layer along laterally opposite sides of gate electrode 113.

For a typical tri-gate device, each semiconductor body 105 has a gate dielectric layer 112 formed on its top surface and sidewalls as shown in FIG. 1. Gate electrode 113 is formed on and adjacent to each gate dielectric 112 on each of the semiconductor bodies 105. Each semiconductor body 105 also includes a source region 116 and a drain region 117 formed in the semiconductor body 105 on opposite sides of gate electrode 113 as shown in FIG. 1. The source regions 116 and drain regions 117 of the semiconductor bodies 105 are electrically coupled together by the semiconductor material used to form semiconductor bodies 105 to form a source landing pad 118 and a drain landing pad 119 as shown in FIG. 1. The source landing pad 118 and drain landing pad 119 are each electrically coupled though metal contact structures 123 to upper levels of interconnect metallization (e.g., metal 1, metal 2, metal 3 . . . ) used to electrically interconnect various transistors 100 together into functional circuits. As shown in FIG. 1, a pair of metal contact structures 123 is provided for each of the semiconductor bodies 105, a first metal contact structure for the source region 116 and a second metal contact for the drain region 117 in order to maintain the parallel circuit architecture of the entire transistor.

With the metal contact architecture shown in FIG. 1, as the pitch of the semiconductor bodies 105 decreases, the pitch 110 of the metal contact structures 123 must also decrease. If the reduction in pitch 110 of the metal contact structures 123 fails to keep pace with the reduction in pitch of the parallel semiconductor bodies, the total resistance of the metal contact structures, the external resistance ($R_{ext}$), becomes a significant contributor to the overall parasitic resistance of the device 100. Thus, the metal contact structures 123 are constrained by the minimum photolithographic pitch of the metal contact structures 123, causing $R_{ext}$ to increase as the pitch of the semiconductor bodies 105 decreases below the minimum photolithographic pitch of the metal contact structures 123.

DETAILED DESCRIPTION OF THE PRESENT INVENTION

A novel contact structure for multiple-channel, non-planar transistors and its method of fabrication is described. In the following description numerous specific details are set forth, such as specific materials, dimension and processes, etc. in order to provide a thorough understanding of the present invention. In other instances, well-known semiconductor process and manufacturing techniques have not been described in particular detail in order to not unnecessarily obscure the present invention.

Embodiments of the present invention include device contact architectures where rectangular metal structures contact the source or drain regions of non-planar transistors having a plurality of semiconductor bodies with channels controlled in parallel by a single gate electrode. Embodiments of the present invention include device contact architectures where at least one metal drain contact structure is coupled to and extends between drain regions of the plurality of semiconductor bodies and at least one metal contact structure is coupled to and extends between source regions of the plurality of semiconductor bodies of multi-channel non-planar transistors. Because the rectangular block contact architecture contacts a plurality of semiconductor bodies, the external resistance ($R_{ext}$) of the multi-channel non-planar device is decreased by reducing current crowding at the source and drain ends of the plurality of semiconductor bodies. In this manner the rectangular block architecture increases the transistor switching speed.

Typically, individual transistor devices have provided enough absolute current to drive circuit logic functions. However, as transistor channel widths shrink to nanometer size, the absolute current carried by a single transistor decreases as well. So, while nanometer size devices have improved speed, their absolute current is no longer sufficient to drive an appreciable load, limiting the applications for an individual nanometer transistor. Therefore, it is advantageous for nanoscale devices having nanometer channels to be configured and operated in parallel, enabling a collective of nanoscale devices to operate at the speed of an individual nanometer channel device and provide sufficient absolute current to drive appreciable loads. Nanoscale devices operated in parallel to achieve the necessary drive current require a form factor at least as small as the larger individual transistor device that provides an equivalent amount of absolute current. This requirement is necessary to avoid sacrificing logic-level integration for the improvement in switching speed of the nanometer channel devices and can be described as layout efficiency. Layout efficiency is a ratio of the absolute current carrying width (Z) of a parallel non-planar device layout to that of the typical planar device occupying the same layout width. Because individual non-planar nanoscale transistors increase the effective current carrying width (Z) relative to an individual planar device occupying the same layout width, the layout efficiency of a single non-planar device is significantly greater than 100 percent. However, as previously stated, the dimensional shrink enabled by the non-planar architecture results in a relatively low absolute current, and so many such non-planar devices may be operated in a parallel configuration. Unless the pitch between the parallel non-planar nanoscale transistors is less than the minimum pitch of the planar transistor, the layout width required to delineate individual non-planar devices can decrease the layout efficiency to below 100 percent. Thus, the total current carrying width of the parallel non-planar device will still be lower than that of individual planar devices unless the pitch of the non-planar devices shrinks proportionally with size of the channel. Since, the typical planar transistor has a channel pitch on the order of the minimum lithographic pitch of the metal contact features, it may be necessary to reduce the non-planar nanoscale transistor pitch to sub-lithographic levels by relying on non-lithographic fabrication techniques, such as spacers and self-alignment, to define the individual nanoscale transistor bodies. The use of such techniques can enable layout efficiencies significantly greater than 100 percent for a multiple nanoscale channel device however it is then impossible to delineate or print lithographically an individual source and drain contact structure for each transistor channel as has always been done for the planar transistor having a minimum lithographic pitch. Furthermore, even if the non-planar transistor bodies are printed by conventional lithography it may be impractically expensive or difficult to achieve the critical dimension control required by conventional contact architecture. Unlike the conventional contact architecture, embodiments of the present invention are not constrained by the minimum lithographic pitch, and do not require sharing minimum-sized contact structures between multiple nanoscale transistors. Embodiments of the present invention reduce the current through the metal contact structure and decrease the $R_{ext}$ of the device, increasing device switching speed.

Figure 2A:
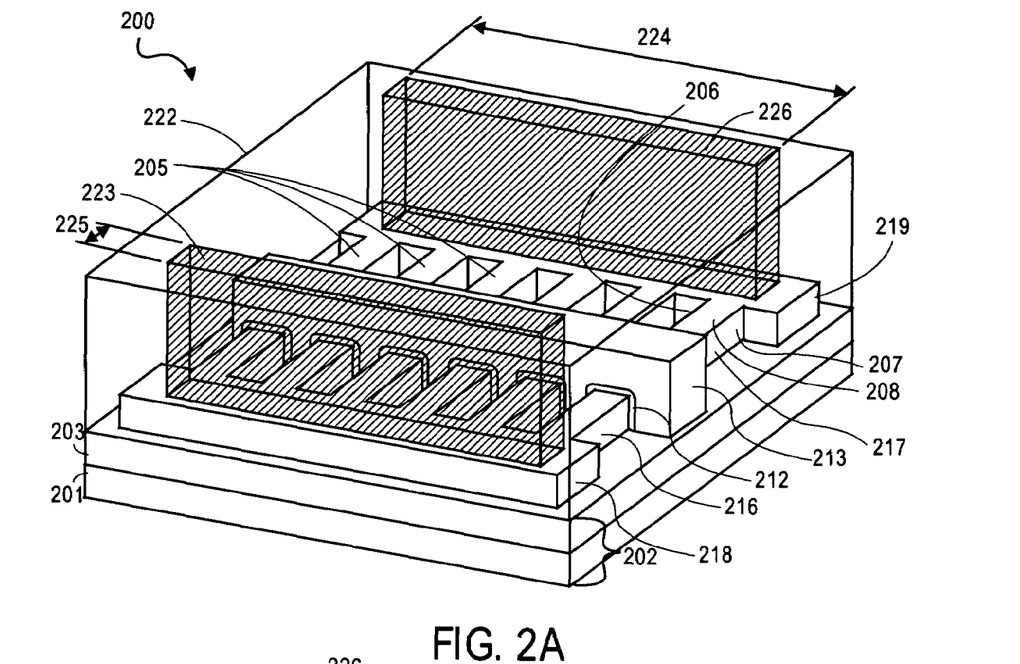
FIG. 2A is an illustration of a perspective view of a multi-channel non-planar transistor having a metal contact architecture in accordance with the present invention.

An example of a multiple-channel non-planar transistor 200 with a metal contact architecture in accordance with an embodiment of the present invention as illustrated in FIG. 2A. Though the non-planar transistor 200 shown in FIG. 2A is a tri-gate device, other non-planar multiple-channel transistor designs such as but not limited to dual-gate, omega-gate, semiconductor nanowire, and carbon nanotube devices are also embodiments of the present invention. Multiple-channel non-planar transistor 200 is formed on a substrate 202. In certain embodiments of the present invention, substrate 202 is an insulating substrate which includes a lower monocrystalline silicon substrate 201 upon which is formed an insulating layer 203, such as a silicon dioxide film. Multiple-channel non-planar transistor 200, however, can be formed on any well-known insulating substrate such as substrates formed from silicon oxide, nitride, carbides, and sapphire. In certain embodiments of the present invention, the substrate 202 can be a "bulk" semiconductor substrate, such as but not limited to monocrystalline silicon substrate and gallium arsenide substrate. A "bulk" semiconductor substrate merely has no insulating layer 203. In an embodiment of the present invention, the substrate 202 is a silicon semiconductor substrate having a doped epitaxial layer with either p-type or n-type conductivity with a concentration level between $1 \times 10^{16}$-$1 \times 10^{19}$ atoms/cm$^3$.

In an embodiment of the present invention, multiple-channel non-planar transistor 200 includes a plurality of semiconductor bodies 205 formed on insulator 203 of insulating substrate 202. Although FIG. 2A shows a tri-gate embodiment of the present invention, it should be appreciated that additional embodiments of non-planar transistors are possible such as but not limited to dual-gate, FinFET, omega-gate, carbon nanotube designs. Semiconductor bodies 205 can be formed of any well-known semiconductor material, such as but not limited to silicon (Si), germanium (Ge), silicon germanium ($Si_xGe_y$), gallium arsenide (GaAs), indium antimonide (InSb), gallium phoshide (GaP), gallium antimonide (GaSb), indium phosphide (InP) and carbon nanotubes. Semiconductor bodies 205 can be formed of any well-known material which can be reversibly altered from an insulating state to a conductive state by applying external electrical controls. Semiconductor bodies 205 are ideally a single crystalline film when the best electrical performance of transistor 200, is desired. For example, semiconductor bodies 205 are a single crystalline film when transistor 200 is used in high performance applications, such as in a high density circuit, such as a microprocessor. Semiconductor bodies 205, however, can be a polycrystalline film when transistor 200 is used in applications requiring less stringent performance, such as in liquid crystal displays. In an embodiment of the present invention, insulator 203 insulates semiconductor bodies 205 from monocrystalline silicon substrate 201. In an embodiment of the present invention, semiconductor bodies 205 are a single crystalline silicon film. In an embodiment of the invention where a "bulk" substrate is used, semiconductor bodies 205 are formed from an upper region of the "bulk" semiconductor substrate. Semiconductor bodies 205 have a pair of laterally opposite sidewalls 206 and 207 separated by a distance which defines an individual semiconductor body or finger width. Additionally, semiconductor bodies 205 have a top surface 208 opposite a bottom surface formed on substrate 202. The distance between the top surface 208 and the bottom surface defines an individual semiconductor body height. In an embodiment of the present invention, the individual body height is substantially equal to the individual semiconductor body width. In an embodiment of the present invention, the individual semiconductor body 205 has a width and a height less than 30 nanometers and ideally less than 20 nanometers. In an embodiment of the present invention, the individual semiconductor body height is between half the individual semiconductor body width to twice the individual semiconductor body width. In an embodiment of the present invention, the spacing between two adjacent semiconductor bodies is less than 30 nanometers and ideally less than 20 nanometers. In an embodiment of the present invention, the spacing between two adjacent semiconductor bodies is less than the individual semiconductor body width. In an embodiment of the present invention, the pitch of the semiconductor bodies, the distance between the sidewall 206 of a semiconductor body and the sidewall 206 of an adjacent semiconductor body, is sub-lithographic. In an embodiment of the present invention, the pitch of the semiconductor bodies is less than 110 nm.

Multiple-channel non-planar transistor 200 has a gate dielectric layer 212. Gate dielectric layer 212 is formed on and around three sides of semiconductor body 205 as shown in FIG. 2A. Gate dielectric layer 212 is formed on or adjacent to sidewall 206, on top surface 208 and on or adjacent to sidewall 207 of the semiconductor bodies 205 as shown in FIG. 2A. Gate dielectric layer 212 can be any well-known dielectric layer. In an embodiment of the present invention, the gate dielectric layer is a silicon dioxide ($SiO_2$), silicon oxynitride ($SiO_xN_y$) or a silicon nitride ($Si_3N_4$) dielectric layer. In an embodiment of the present invention, the gate dielectric layer 212 is a silicon oxynitride film formed to a thickness of between 5-20 Å. In an embodiment of the present invention, gate dielectric layer 212 is a high K gate dielectric layer, such as a metal oxide dielectric, such as but not limited to tantalum oxide, titanium oxide, halfnium oxide, zirconium oxide, and aluminum oxide. Gate dielectric layer 212 can be other types of high K dielectric, such as but not limited to lead zirconium titanate (PZT).

Multiple-channel non-planar transistor 200 has a gate electrode 213 as shown in FIG. 2A. Gate electrode 213 is formed on and around gate dielectric layer 212 as shown in FIG. 2A. Gate electrode 213 is formed on or adjacent to gate dielectric 212 formed on sidewall 206 of each of the semiconductor bodies 205, is formed on gate dielectric 212 formed on the top surface 208 of each of the semiconductor bodies 205, and is formed adjacent to or on gate dielectric layer 212 formed on sidewall 207 of each of the semiconductor bodies 205. Gate electrode 213 has a pair of laterally opposite sidewalls separated by a distance which defines the gate length ($L_g$) of transistor 200. In an embodiment of the present invention, the laterally opposite sidewalls of the gate electrode 213 run in a direction perpendicular to the laterally opposite sidewalls 206 and 207 of the semiconductor bodies 205.

Gate electrode 213 can be formed of any suitable gate electrode material. In an embodiment of the present invention, the gate electrode 213 comprises polycrystalline silicon doped to a concentration density between $1\times10^{19}$ atoms/$cm^3$ and $1\times10^{20}$ atoms/$cm^3$. In an embodiment of the present invention, the gate electrode can be a metal gate electrode such as but not limited to tungsten, tantalum, titanium, nickel, cobalt, aluminum, and corresponding nitrides and silicides. In an embodiment of the present invention, the gate is formed from a carbon nanotube. In an embodiment of the present invention, the gate electrode is formed from a material having a mid-gap work function between 4.6-4.9 eV. It is to be appreciated, the gate electrode 213 need not necessarily be a single material and can be a composite stack of thin films such as but not limited to a polycrystalline silicon/metal electrode or a metal/polycrystalline silicon electrode.

Multiple-channel non-planar transistor 200, as shown in FIG. 2A, has source regions 216 and drain regions 217 of the semiconductor bodies 205. Source regions 216 and drain regions 217 are formed in the semiconductor bodies 205 on opposite sides of gate electrode 213 as shown in FIG. 2A. The source region 216 and the drain region 217 are formed of the same conductivity type such as n-type or p-type conductivity. In an embodiment of the present invention, source region 216 and drain region 217 have a doping concentration of $1\times10^{19}$-$1\times10^{21}$ atoms/$cm^3$. Source region 216 and drain region 217 can be formed of uniform concentration or can include subregions of different concentrations or doping profiles such as tip regions (e.g., source/drain extensions).

In an embodiment of the present invention, source region 216 and drain region 217 can include a silicon or other semiconductor film formed on and around semiconductor bodies 205. For example, semiconductor film can be a silicon film or a silicon alloy such as silicon germanium ($Si_xGe_y$) to form "raised" source and drain regions. In an embodiment of the present invention, a silicide film, such as, but not limited to, titanium silicide, nickel silicide, and cobalt silicide is formed on the source region 216 and drain region 217. In an embodiment of the present invention, silicide film is formed directly on the top surface 208 of the semiconductor bodies 205. In an embodiment of the present invention, the source regions 216 and drain regions 217 are fully silicided (FUSI).

In an embodiment of the present invention, the source regions 216 and drain regions 217 of the semiconductor bodies 205 are electrically coupled together by the material used to form semiconductor bodies 205 to form a common source rail or landing pad 218 and a common drain rail or landing pad 219 as shown in FIG. 2A. In an alternate embodiment the source regions 216 and drain regions 217 of each of the semiconductor bodies 205 remain electrically isolated from each other and no common source or drain landing pad is formed.

The portion of semiconductor body 205 located between source region 216 and drain region 217, defines one channel region of the multiple-channel non-planar transistor 200 and is surrounded by the gate electrode 213. In an embodiment of the present invention, channel region is intrinsic or undoped monocrystalline silicon. In an embodiment of the present invention, channel region is doped monocrystalline silicon. When channel region is doped it is typically doped to a conductivity level of between $1\times10^{16}$ to $1\times10^{19}$ atoms/$cm^3$. In an embodiment of the present invention, when the channel region is doped it is typically doped to the opposite conductivity type of the source region 216 and the drain region 217. For example, when the source and drain regions are n-type conductivity the channel region would be doped to p-type conductivity. Similarly, when the source and drain regions are p-type conductivity the channel region would be n-type conductivity. In this manner a multiple-channel non-planar transistor 200 can be formed into either an NMOS transistor or a PMOS transistor respectively.

Multiple-channel non-planar transistor 200 is encapsulated in an insulating media, or interlayer dielectric (ILD) 222 as shown in FIG. 2A. In an embodiment of the present invention, the ILD is a material having a low dielectric constant, such as a film with high porosity or a film of carbon-doped oxide. In an embodiment of the present invention, the ILD is formed from PSG, BPSG, silicon dioxide, silicon nitride, or a composite of these or other commonly known materials.

Multiple-channel non-planar transistor 200, as shown in FIG. 2A, is electrically coupled to external devices through the ILD 222 with rectangular block contact structures 223 and 226. Contact structures may be of any commonly known conductive material, such as but not limited to aluminum, gold, titanium, tungsten, silver, and carbon nanotubes. In an embodiment of the present invention, the metal contact structures 223 and 226 are copper. In an embodiment of the present invention, the metal contact structures 223 and 226 have additional barrier layers such as but not limited to tantalum, tantalum nitride, titanium, and titanium nitride.

It is to be appreciated that the rectangular block contact structures, 223 and 226 may be dimensioned independently of each other. It should also be appreciated that an architecture describing one block contact structure, such as the source contact structure 223, may be independently applied to the architecture of the drain contact structure 226. Therefore, the structures described in various embodiments or shown in FIGS. 2A-2D can be utilized for either the source or drain contact in any combination.

In an embodiment of the present invention, as shown in FIG. 2A, one metal source contact structure 223 contacts the source regions 216 and one metal drain contact structure 226 contacts the drain regions 217 of the multiple semiconductor bodies 205. In an embodiment of the present invention, the metal source contact structure 223 has a width 224 approximately equal to the number of semiconductor bodies 205 multiplied by the pitch of the semiconductor bodies 205 of the transistor and a length 225 approximately equal to the minimum photolithographic feature size. In an embodiment of the present invention, the metal drain contact structure 226 has a width approximately equal to the number of semiconductor bodies 205 multiplied by the pitch of the semiconductor bodies 205 of the transistor and a length approximately equal to the minimum photolithographic feature size. In a further embodiment of the present invention the source contact structure 223 has a width 224 substantially greater than the length 225 while the drain contact structure 226 has a width about equal to the minimum lithographic dimension. Similarly, drain contact structure 226 may also be so dimensioned to be a block contact having the width substantially greater than the length while the source contact structure has minimum lithographic dimensions. In embodiments of the invention, the length 225 of the contact structure 223 may be larger than the minimum lithographic dimension, allowing for misalignment tolerances.

In an embodiment of the present invention, the source contact structure 223 makes contact to the common source rail or landing pad 218, as shown in FIG. 2A. In an embodiment of the present invention, the metal drain contact 226 makes contact to the common drain rail or landing pad 219 of the multiple-channel non-planar transistor 200.

By dimensioning single contact structures in the manners stated, the minimum pitch of the lithography used to define the location of the metal block contact structures no longer constrains device design even when the minimum pitch of the semiconductor bodies 205 is sub-lithographic. Furthermore, as the metal block contact structure width, 224 becomes significantly greater than the length 225, the block contact structure 223 begins to approximate a one-dimensional slot. Such a one-dimensional slot can have a lithographically defined length 225 that is smaller than the length of a contact structure which is two-dimensional (having a width 224 approximately equal to a length 225) because of the improved resolution of one-dimensional imaging.

Figure 2B:
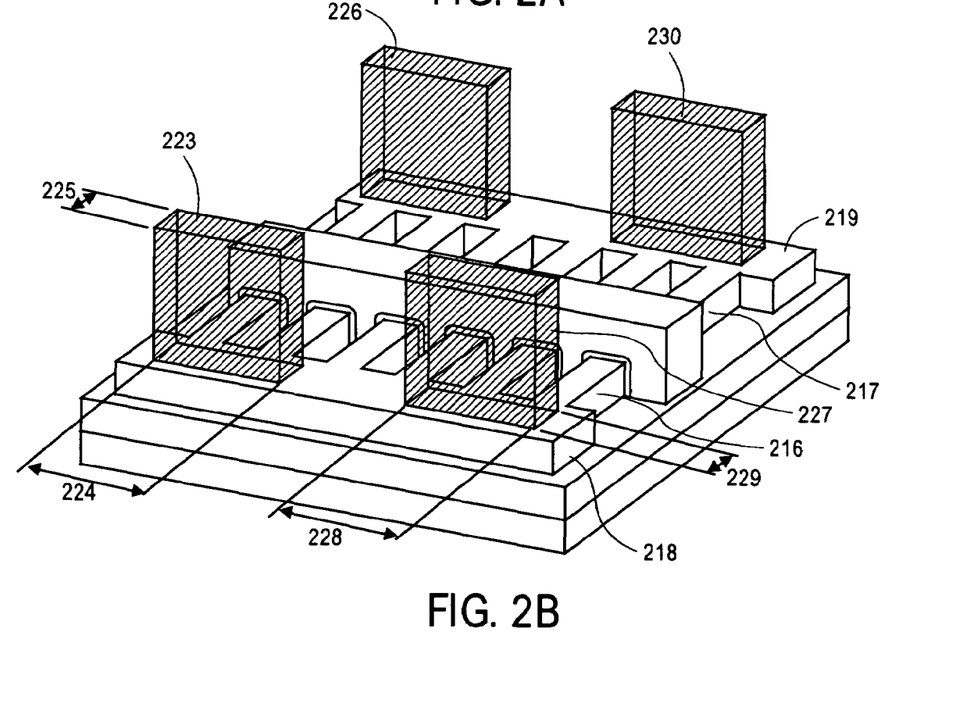
FIG. 2B is an illustration of a perspective view of a multi-channel non-planar transistor having a metal contact architecture in accordance with the present invention.

In an embodiment of the present invention, as shown in FIG. 2B, multiple source contact structures 223 and 227 contact the common source landing pad 218 and multiple drain contact structures 226 and 230 contact the common drain landing pad, 219. In a further embodiment of the present invention the source contact structures contact the plurality of source regions without a common source landing pad and the drain contact structures contact the plurality of drain regions without a common drain landing pad. In an embodiment of the present invention, the block contact structures have a width 224 substantially greater than a length 225, as shown in FIG. 2B. In an embodiment of the present invention, contact structure 223 has a width 224 that differs from the width 228 of contact structure 227. In an embodiment of the present invention, contact structure 223 has a length 225 that differs from the length 229 of contact structure 227.

Figure 2C:
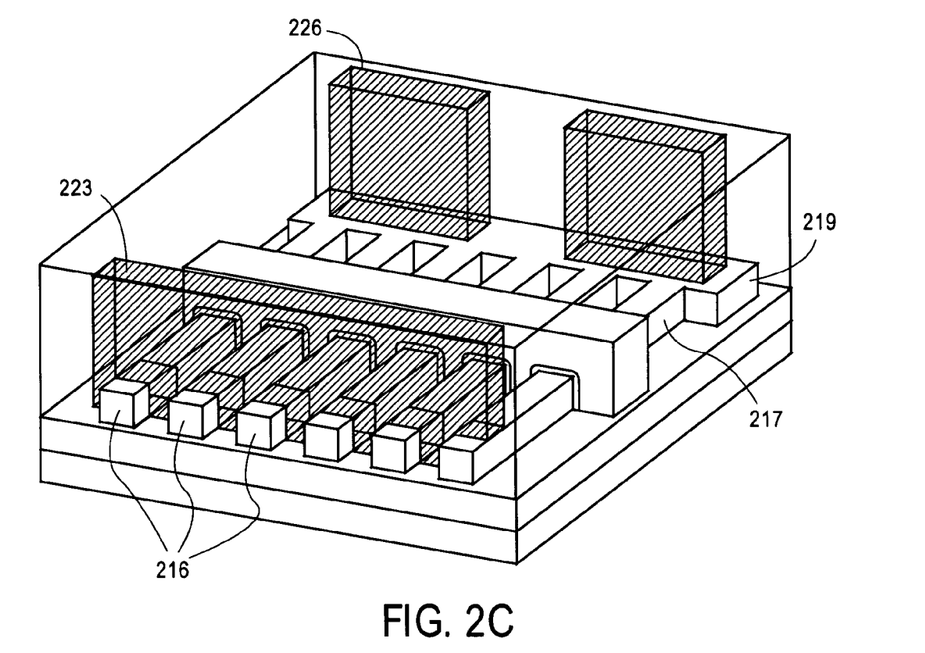
FIG. 2C is an illustration of a perspective view of a multi-channel non-planar transistor having a metal contact architecture in accordance with the present invention.

In an embodiment of the present invention, a single metal source contact structure 223 makes contact directly to the plurality of source regions 216 in a self-aligned fashion without a common source landing pad, while drain contacts structure 226 makes contact to the drain regions 217 by means of drain landing pad 219, as shown in FIG. 2C. In a similar fashion, metal drain contact structures make contact directly to the plurality of drain regions without a common drain landing pad. In this manner the effective surface area of the metal contact structure is increased by the step height of the non-planar device because the metal contact structure wraps around the non-planar source regions 216 and the non-planar drain regions 217. Much like the non-planar transistor has an increased the channel width, the non-planar contact will have an increased contact width relative to a linear contact, thereby lowering the contact resistance and lowering the total parasitic resistance of the parallel device.

Figure 2D:
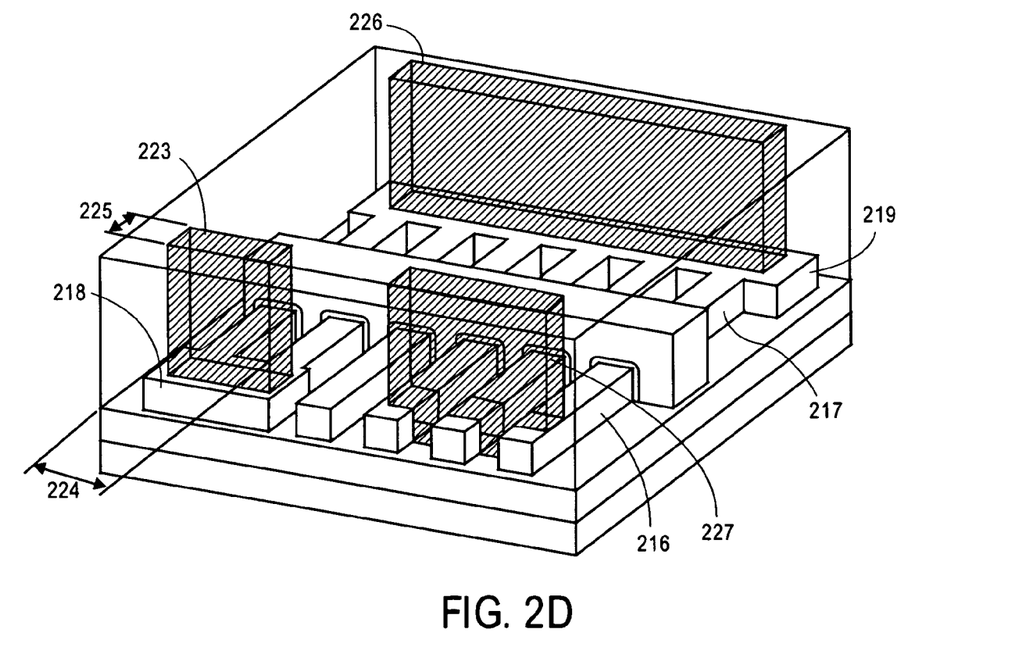
FIG. 2D is an illustration of a perspective view of a multi-channel non-planar transistor having a metal contact architecture in accordance with the present invention.

In certain embodiments of the present invention, multiple-channel non-planar transistor, as shown in FIG. 2D, is electrically coupled to external devices using multiple metal source contact structures 223 and 227 contacting the source regions 216 or source landing pad 218. In a further embodiment of the present invention multiple metal drain contact structures contact the drain regions 217 in a similar fashion. In an embodiment of the present invention, at least one of the metal source contact structures 223 and 227 has a width 224 greater than the pitch of the semiconductor bodies but less than the number of semiconductor bodies multiplied by the pitch of the semiconductor bodies and a length 225 on the order of the minimum lithographic feature size. In other embodiments of the present invention, at least one of the metal drain contact structures 226 have a width greater than the pitch of the semiconductor bodies but less than the number of semiconductor bodies multiplied by the pitch of the semiconductor bodies and a length about the minimum lithographic feature size and contact the drain regions 217 or landing pad 219.

In an embodiment of the present invention, multiple source contact structures 223 and 227 contact the source regions 216 and a single metal drain contact structure 226 contacts the drain regions 217 or the landing pad 219, as shown in FIG. 2D. In certain embodiments of the present invention, a single metal source contact structure contacts the source regions while multiple drain contact structures contact the drain regions of the semiconductor bodies. In an embodiment of the present invention, the single source contact structure contacts the common source landing pad while the multiple drain contact structures contact a plurality of drain regions. In this manner it is possible to perform basic fan-out, adder, or other logic operations within a parallel device and take advantage of the superior layout efficiency afforded by utilizing transistors having a sub-lithographic pitch, as previously stated. As the semiconductor bodies have sub-lithographic pitch, not all semiconductor bodies will necessarily be contacted by the contact structures 223 and 227 in this embodiment of the invention. However, because the semiconductor bodies are operating in parallel a failure to contact some of the semiconductor bodies will not necessarily be detrimental to the operation of the overall device if sufficient drive current is achieved by the semiconductor bodies which are contacted by structures 223 and 227.

Figure 3A:
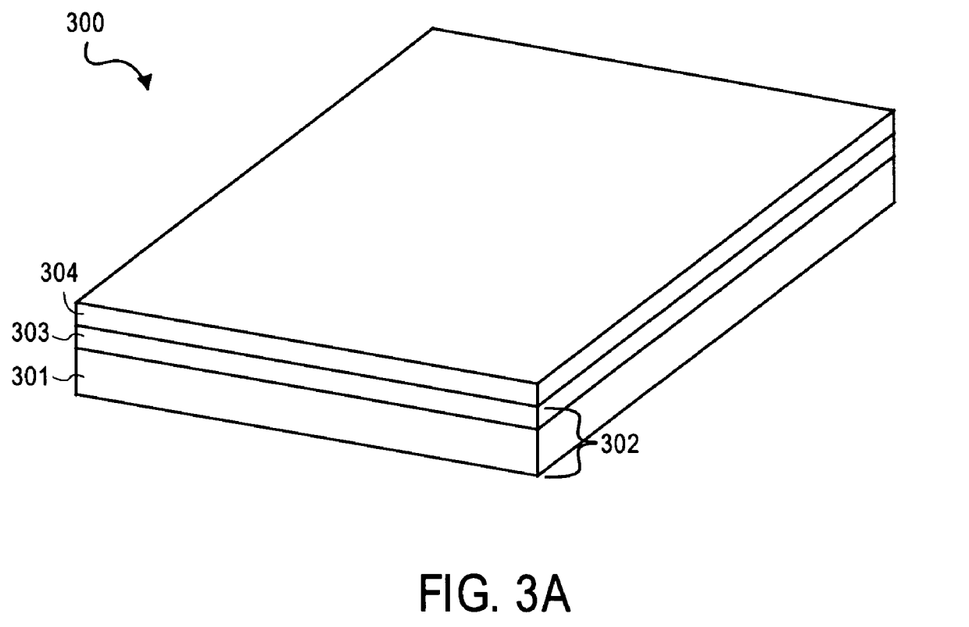
FIG. 3A-3L are illustrations of perspective and cross sectional views of a method of fabricating a multi-channel non-planar transistor having a contact architecture in accordance with the present invention.
Figure 3B:
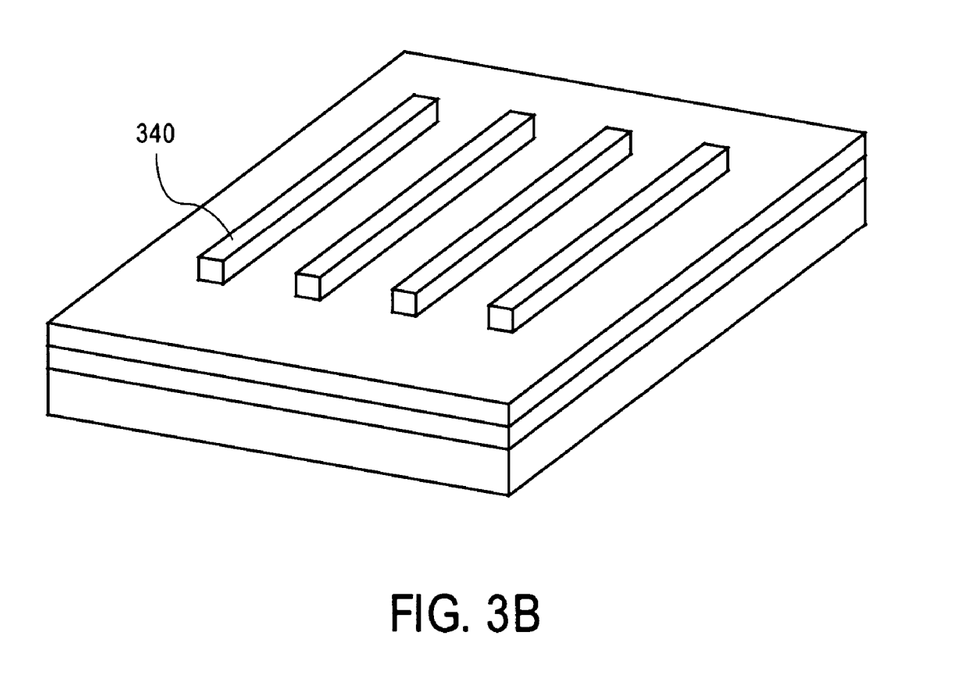
Figure 3C:
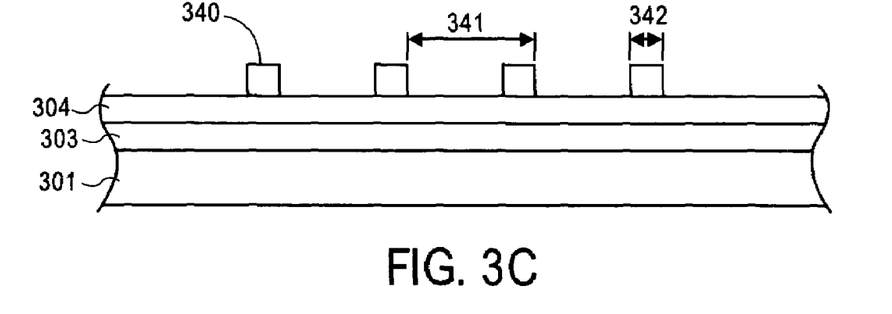

A method of fabricating a tri-gate transistor in accordance with an embodiment of the present invention is illustrated in FIGS. 3A-3L. The fabrication of a non-planar transistor begins with substrate 302. A silicon or semiconductor film 304 is formed on substrate 302 as shown in FIG. 3A. In an embodiment of the present invention, the substrate 302 is an insulating substrate, such as shown in FIG. 3A. In an embodiment of the present invention, insulating substrate 302 includes a lower monocrystalline silicon substrate 301 and an insulating layer 303, such as a silicon dioxide film or silicon nitride film. Insulating layer 303 isolates semiconductor film 304 from substrate 302, and in embodiment is formed to a thickness between 200-2000 Å. Insulating layer 303 is sometimes referred to as a "buried oxide" layer. When a silicon or semiconductor film 304 is formed on an insulating substrate 301, a silicon or semiconductor on insulating (SOI) substrate 300 is created. In other embodiments of the present invention, the substrate 302 can be a "bulk" semiconductor substrate, such as but not limited to a silicon monocrystalline substrate and a gallium arsenide substrate. In an embodiment of the invention where a "bulk" substrate is used, semiconductor layer 304 is merely an upper region of the semiconductor substrate. Therefore, it should be understood that embodiments relating to semiconductor film 304 are also applicable to "bulk" device embodiments utilizing "bulk" substrates. In certain embodiments of the present invention, the substrate 302 is a silicon semiconductor substrate having a doped epitaxial layer with either p-type or n-type conductivity with a concentration level between $1\times10^{16}$-$1\times10^{19}$ atoms/cm$^3$.

Although semiconductor film 304 is ideally a silicon film, in other embodiments it can be other types of semiconductor films, such as but not limited to germanium (Ge), a silicon germanium alloy ($Si_xGe_y$), gallium arsenide (GaAs), InSb, GaP, GaSb, InP as well as carbon nanotubes. In an embodiment of the present invention, semiconductor film 304 is an intrinsic (i.e., undoped) silicon film. In other embodiments, semiconductor film 304 is doped to p-type or n-type conductivity with a concentration level between $1\times10^{16}$-$1\times10^{19}$ atoms/cm$^3$. Semiconductor film 304 can be insitu doped (i.e., doped while it is deposited) or doped after it is formed on substrate 302 by for example ion-implantation. Doping after formation enables both PMOS and NMOS tri-gate devices to be fabricated easily on the same insulating substrate. The doping level of the semiconductor body at this point can determine the doping level of the channel region of the device.

In certain embodiments of the present invention, semiconductor film 304 is formed to a thickness which is approximately equal to the height desired for the subsequently formed semiconductor body or bodies of the fabricated tri-gate transistor. In an embodiment of the present invention, semiconductor film 304 has a thickness or height of less than 30 nanometers and ideally less than 20 nanometers. In another embodiment of the present invention, semiconductor film 304 is formed to the thickness approximately equal to one-third of the gate "length" desired of the fabricated tri-gate transistor. In an embodiment of the present invention, semiconductor film 304 is formed thicker than desired gate length of the device. In certain embodiments of the present invention, semiconductor film 304 is formed to a thickness which will enable the fabricated tri-gate transistor to be operated in a fully depleted manner for its designed gate length (Lg).

Semiconductor film 304 can be formed on insulating substrate 302 in any well-known method. In one method of forming a silicon on insulator substrate, known as the separation by implantation of oxygen (SIMOX) technique. Another technique currently used to form SOI substrates is an epitaxial silicon film transfer technique which is generally referred to as bonded SOI. In certain embodiments of the present invention, semiconductor film 304 is a portion of the "bulk" semiconductor substrate.

At this time, if desired, isolation regions (not shown) can be formed into substrate 300 in order to isolate the various transistors to be formed therein from one another. Isolation regions can be formed by etching away portions of the semiconductor film 304 surrounding a tri-gate transistor, by for example well-known photolithographic and etching techniques. If desired, back filling the etched regions with an insulating film, such as $SiO_2$ can be performed.

At this time, semiconductor bodies can be formed from semiconductor film 304 using commonly known photolithography and subtractive etch techniques to define semiconductor bodies. In certain embodiments of the present invention, semiconductor bodies have lithographic size and pitch. In certain embodiments of the present invention, sub-lithographic fabrication techniques such as spacers can be utilized to form semiconductor bodies having sub-lithographic pitch, as shown in FIGS. 3B-3F. In one method, a first mask layer is formed from a commonly known dielectric or metallic material. In an embodiment of the present invention, the first mask layer is a nitride. In an embodiment of the present invention, the first mask layer is an oxide. In another embodiment of the present invention, the first mask layer is polycrystalline silicon. As shown from a perspective view in FIG. 3B, the first mask layer can be defined into a pattern of mandrel structures 340 through the use of commonly known photolithography and etching processes. The mandrel structures 340 are shown in cross-sectional view in FIG. 3C. The mandrels 340 have a height, width, and pitch sufficient for a subsequently formed spacer to have a predetermined pitch and width. In certain embodiments of the present invention, the mandrel structures can be given the minimum lithographic pitch 341 and width 342 resolvable by the particular photolithographic equipment used. In an embodiment of the present invention, the mandrel structures are patterned with 193 nm lithography. In an embodiment of the present invention, the mandrel structures have a pitch 341 of approximately 110 nm. In an embodiment of the present invention, the photodefined layer used to define the mandrel 340 is further reduced in dimension by commonly known techniques such as but not limited to isotropically etching with a dry develop or wet etch process. In a further embodiment of the present invention, mandrel structures 340 are reduced in dimension after patterning by an isotropic etch process.

Figure 3D:
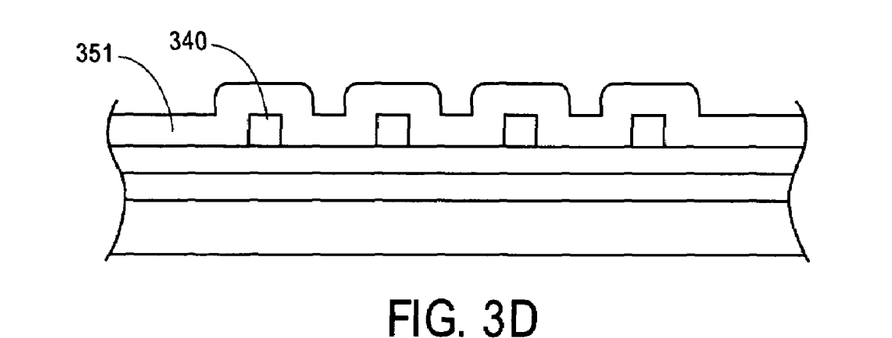

In certain embodiments of the present invention, a second mask layer 351 is formed over the mandrel structures, as shown in FIG. 3D. The second mask material is of a type commonly known to be suited to forming a spacer having a property enabling it to withstand the method used to subsequently remove the mandrel. The thickness of the second mask material is selected so as to enable the subsequent formation of a spacer having a predetermined width. In an embodiment of the present invention, the second mask layer 351 can be a commonly known material such as but not limited to a nitride, an oxide, or polycrystalline silicon. The second mask layer 351 can be a commonly known metallic material. Commonly known techniques to deposit second mask layer 351 can be used to achieve the desired step coverage or conformality needed, such as but not limited to chemical vapor deposition (CVD), plasma enhanced CVD (PECVD), high density plasma (HDP), or atomic layer deposition (ALD).

Figure 3E:
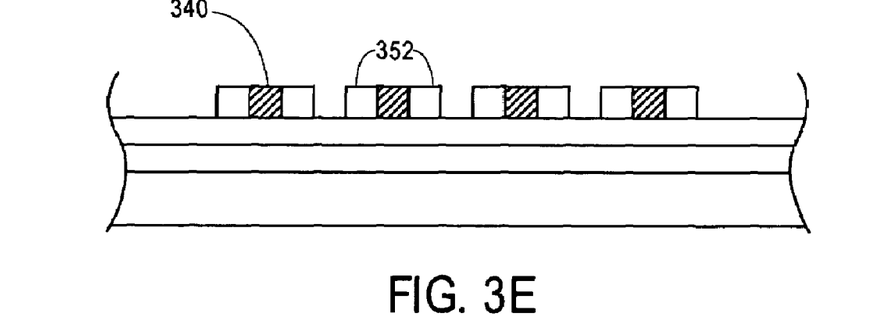
Figure 3F:
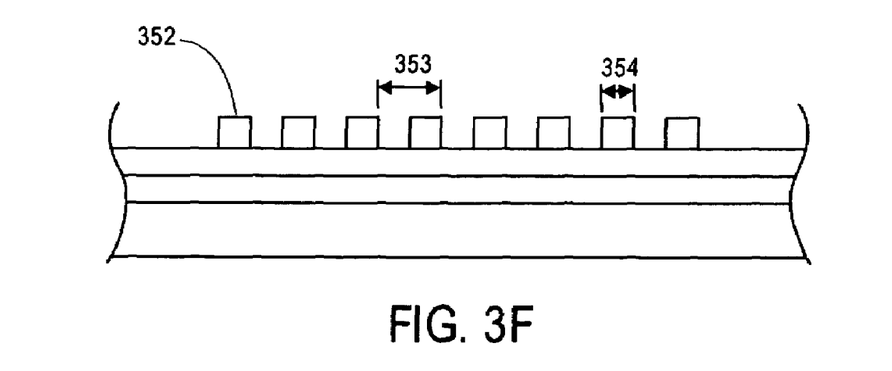

As shown in FIG. 3E, the second mask material can be formed into spacers 352 adjacent to the sidewalls of the mandrels 340 using any commonly known anisotropic etching technique suitable for the second mask material.

At this point the mandrels can be removed by any etching technique which selectively removes the mandrels without substantially altering spacers 352. In an embodiment of the present invention, the mandrels are etched away using a commonly known wet chemical etch processes. In another embodiment of the present invention, the mandrels are removed in commonly known plasma etch processes. Once the mandrels have been removed, spacer structures 352 having a predetermined pitch 353 and width 354 remain, as shown in a cross-sectional view in FIG. 3F. In an embodiment of the present invention, the pitch 353 of the spacer structures 352 is sub-lithographic. In an embodiment of the present invention, the spacer structure pitch 353 is about half of the pitch of the mandrel structures. In an embodiment of the present invention, the spacer structures 352 have a pitch on the order of 55 nm. As shown in perspective view in FIG. 3G, the spacer structures 352 form a pattern or plurality of patterns defining locations where semiconductor bodies or fins will be subsequently formed in the semiconductor film 304. The spacer 352 pattern defines the width 354 desired of the subsequently formed semiconductor bodies or fins of the tri-gate transistor. In an embodiment of the present invention, the spacer structures 352 will have a width 353 less than or equal to 30 nanometers and ideally less than or equal to 20 nanometers. As can be appreciated by one of ordinary skill in the art, the process of forming the spacer structures 352 could be iterated, each time doubling the number of spacer structures 352 while potentially reducing the spacer pitch 353 and spacer width 354.

Figure 3G:
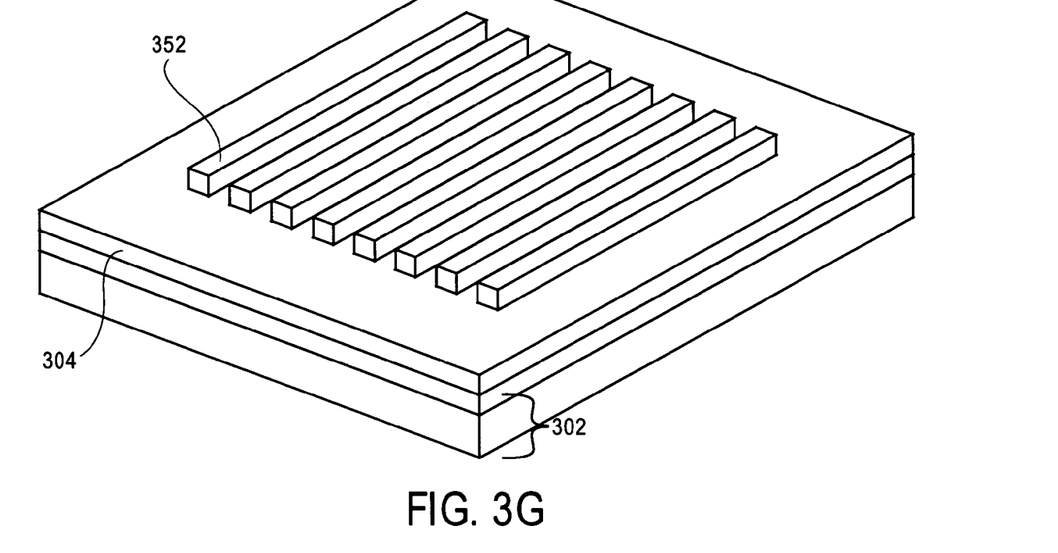
Figure 3H:
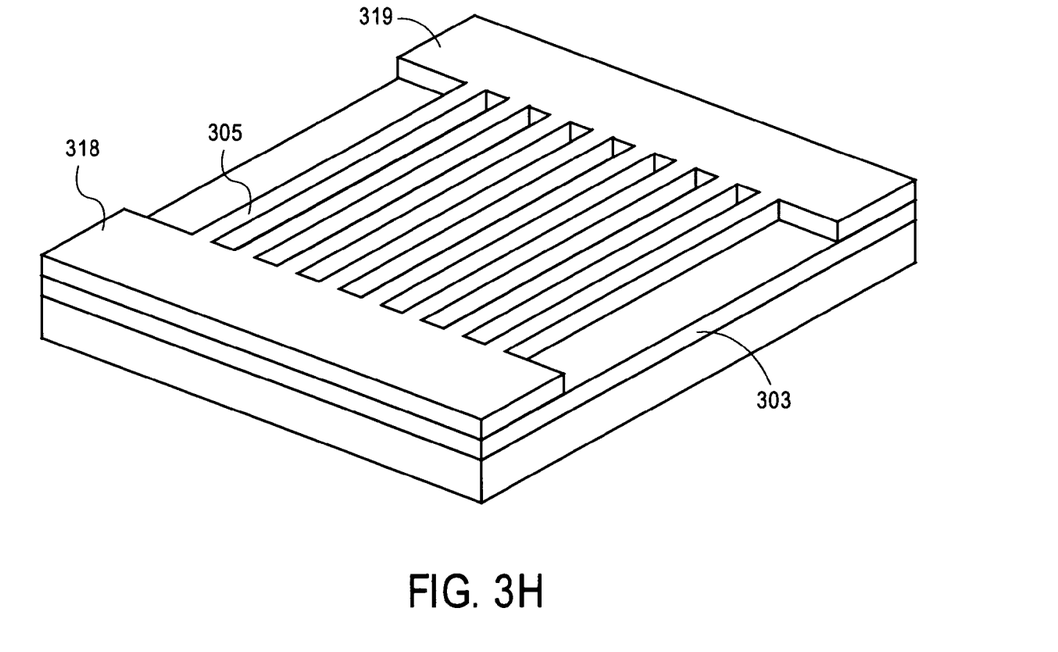

At this time, if desired, a photo definable mask (not shown) can be used to augment the spacer structures 352, selectively protecting areas of the semiconductor film 304 which are not already protected by the spacer structures 352 in order to form a tri-gate transistor on substrate 300. The photoresist mask can also define source landing pads and drain landing pads. The landing pads can be used to connect together the various source regions and to connect together the various drain regions of the fabricated transistor. In certain embodiments of the present invention, the photoresist mask is further used to define other semiconductor bodies having lithographic pitch. The photoresist mask can be formed by well-known photolithographic techniques including masking, exposing, and developing a blanket deposited photoresist film. After forming photoresist mask, semiconductor film 305 is etched in alignment with photoresist mask and spacer structures 352 to form one or more silicon bodies or fins and source or drain landing pads, 318 and 319 respectively, as shown in FIG. 3H. In certain embodiments of the present invention, semiconductor film 304 in FIG. 3G is etched until the underlying buried oxide layer 303 is exposed. In embodiments of the present invention where a "bulk" substrate is used, semiconductor film 304 is etched to a desired depth. Well-known semiconductor etching techniques, such as anisotropic plasma etching or reactive ion etching can be used to define semiconductor bodies 305 as shown in FIG. 3H. At this time, spacer structures 352 and photo resist can be removed with commonly known techniques. At this point, embodiments where semiconductor bodies 305 have lithographic pitch as well as embodiments where semiconductor bodies 305 have sub-lithographic pitch can be both be represented by FIG. 3H.

Figure 3I:
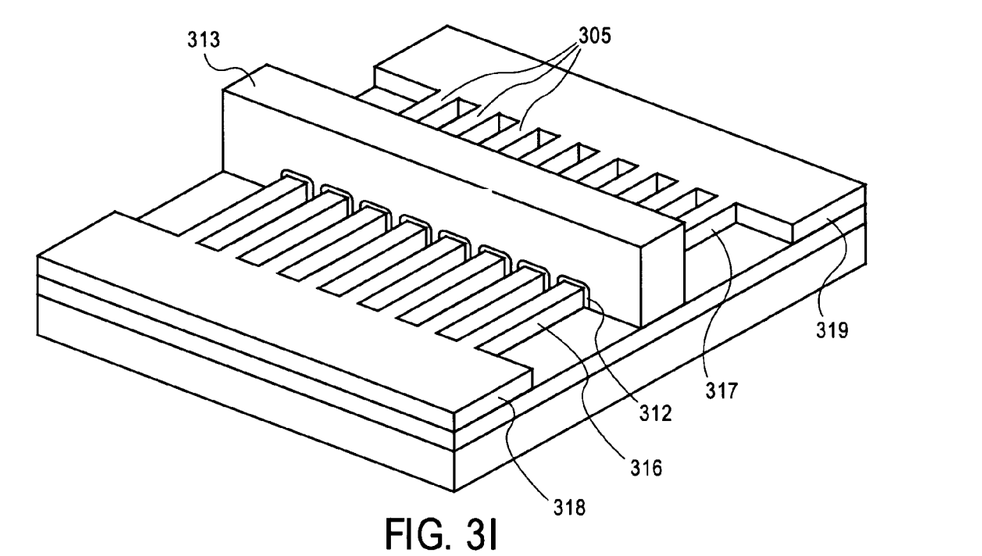

Next, a gate dielectric layer, as shown in FIG. 3I is formed on each semiconductor body 305 in a manner dependent on the type of non-planar device (dual-gate, tri-gate, omega-gate, carbon nanotube). In an embodiment of the present invention, a gate dielectric layer 312 is formed on the top surface of each of the semiconductor bodies 305 as well as on the laterally opposite sidewalls of each of the semiconductor bodies 305. The gate dielectric can be a deposited dielectric or a grown dielectric. In an embodiment of the present invention, the gate dielectric layer 312 is a silicon dioxide dielectric film grown with a dry/wet oxidation process. In an embodiment of the present invention, the silicon oxide film is grown to a thickness of between 5-15 Å. In an embodiment of the present invention, the gate dielectric film 312 is a deposited dielectric, such as but not limited to a high dielectric constant film, such as metal oxide dielectric, such as tantalum pentaoxide, titanium oxide, halfnium oxide, zirconium oxide, aluminum oxide, or other high-K dielectrics, such as barium strontium titanate (BST). A high dielectric constant film can be formed by well-known techniques, such as by chemical vapor deposition (CVD) and atomic layer deposition (ALD). In an embodiment of the present invention, the gate dielectric can be comprised of a composite of such films.

Next, as shown in FIG. 3I, a gate electrode 313 is formed. The gate electrode 313 is formed on the gate dielectric layer 312 formed on the top surface of each of the semiconductor bodies 305 and is formed on or adjacent to the gate dielectric 312 formed on or adjacent to the sidewalls of each of the semiconductor bodies 305 as shown in FIG. 3I. The gate electrode can be formed to a thickness between 200-3000 Å. In an embodiment the gate electrode has a thickness of at least three times the height of the semiconductor bodies 305.

In embodiment of the present invention, the gate electrode material comprises polycrystalline silicon. In another embodiment of the present invention, the gate electrode material comprises a polycrystalline silicon germanium alloy. In yet other embodiments of the present invention, the gate electrode material can comprise a metal film, such as nickel, cobalt, tungsten, titanium, tantalum, aluminum, and their nitrides and silicides. In a further embodiment of the present invention the gate electrode can be a carbon nano-tube. Gate electrode 313 can be formed by well-known techniques, such as by blanket depositing a gate electrode material over the substrate of and then patterning the gate electrode material with well-known photolithography and etching techniques. In certain embodiments of the present invention, the photolithography process used to define gate electrode 313 utilizes the minimum or smallest dimension lithography process used to fabricate the non-planar transistor. In an embodiment of the present invention, a mandrel-type process similar to the one described for defining the semiconductor bodies 305 or commonly known oxidation techniques can be used to form a gate electrode 313 having sub-lithographic dimensions. In other embodiments of the present invention "replacement gate" methods are used to form the gate electrode 313.

Next, source regions 316 and drain regions 317 for the transistor are formed in semiconductor body 305 on opposite sides of gate electrode 313, as shown in FIG. 3I. In an embodiment of the present invention, the source and drain regions include tip or source/drain extension regions which can be formed by placing dopants into semiconductor bodies of gate electrode. If source and drain landing pads 318 and 319 are utilized, they may be doped at this time also. For a PMOS tri-gate transistor, the semiconductor fins or bodies 305 are doped to p-type conductivity and to a concentration between $1 \times 10^{20}$-$1 \times 10^{21}$ atoms/cm$^3$. For a NMOS tri-gate transistor, the semiconductor fins or bodies 305 are doped with n-type conductivity ions to a concentration between $1 \times 10^{20}$-$1 \times 10^{21}$ atoms/cm$^3$. In an embodiment of the present invention, the silicon films are doped by ion-implantation. In a further embodiment of the present invention, the ion-implantation occurs in a vertical direction. When gate electrode 313 is a polysilicon gate electrode, it can be doped during the ion-implantation process. Gate electrode 313 acts as a mask to prevent the ion-implantation step from doping the channel region(s) of the tri-gate transistor. The channel region is the portion of the silicon body 305 located beneath or surrounded by the gate electrode 313. If gate electrode 313 is a metal electrode, a dielectric hard mask maybe used to block the doping during the ion-implantation process. In other embodiments, other methods, such as solid source diffusion, may be used to dope the semiconductor body to form source and drain extensions. In embodiments of the present invention, "halo" regions can be formed in silicon body prior to the formation of a source/drain regions or source/drain extension regions.

Next, if desired, the substrate can be further processed to form additional features, such as heavily doped source/drain contact regions, deposited silicon or silicon germanium on the source and drain regions as well as the gate electrode, and the formation of silicide on the source/drain contact regions as well as on the gate electrode. In embodiments of the present invention, dielectric sidewall spacers can be formed on the sidewalls of the gate electrode. Sidewall spacers can be utilized to offset heavy source/drain contact implants, can be used to isolate source/drain regions from the gate electrode during a selective silicon or silicon germanium deposition/growth processes and can be used in a salicide process to form silicide or germanicide on the source and drain regions as well as on the gate electrode. In certain embodiments of the present invention, a full silicidation (FUSI) is performed.

Figure 3J:
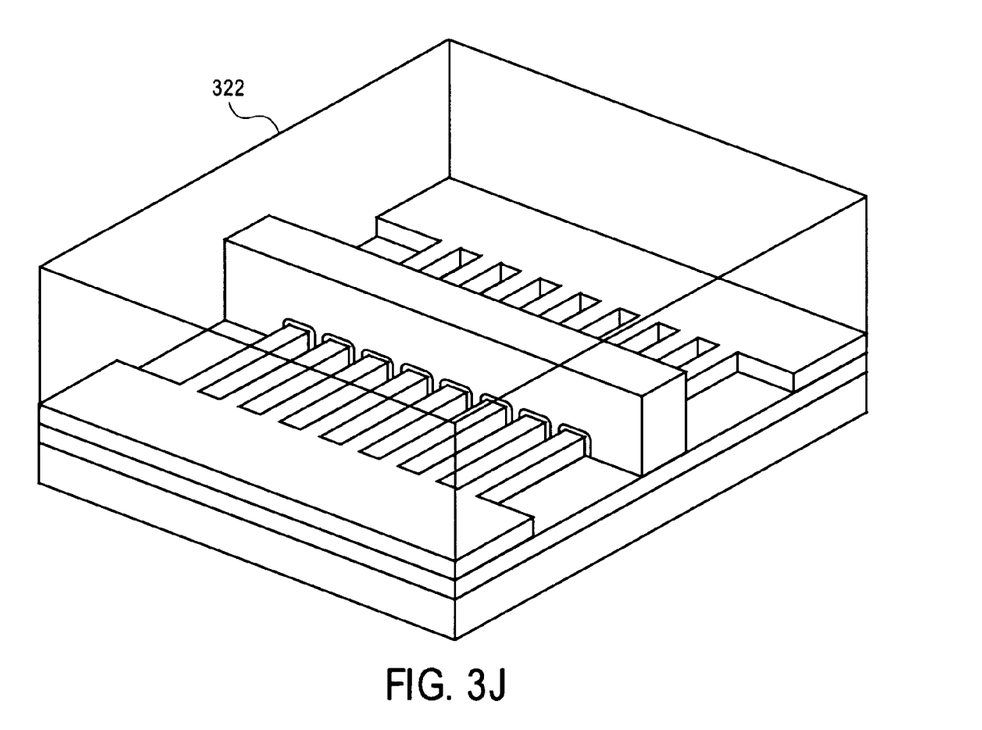

Next the device is encapsulated with an insulating layer, or interlayer dielectric (ILD) 322, as shown in FIG. 3J, having sufficient thickness to isolate the device. In certain embodiments of the present invention, the ILD 322 is commonly known material such as phosphosilicate glass (PSG), borophosphosilicate glass (BPSG), tetraethylorthosilicate (TEOS), silicon dioxide, silicon nitride, or a composite of such materials. In an embodiment of the present invention, the ILD 322 is a material having a lower dielectric constant than silicon dioxide, such as but not limited to a porous dielectric material, or carbon-doped silicate dielectric material. The ILD can be blanket deposited by commonly known processes such as but not limited to low pressure chemical vapor deposition (LPCVD), PECVD, and HDP.

Figure 3K:
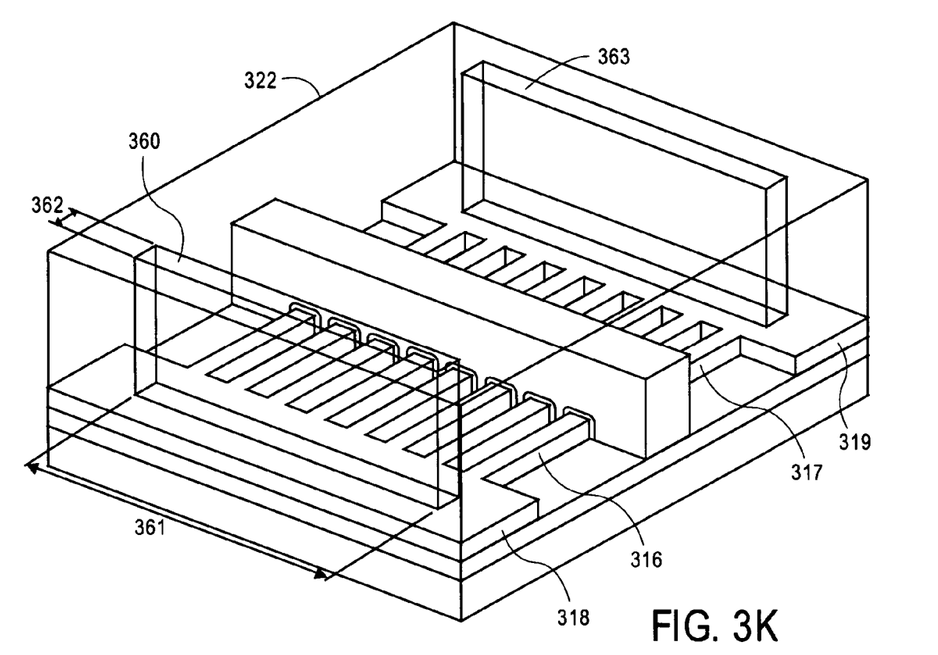

Next the ILD 322 is patterned and etched to define the location of openings for the metal contact structures 360 and 363, as shown in FIG. 3K. In certain embodiments of the present invention, the photolithography process used to define contact openings 360 and 363 have a minimum lithographic pitch greater than the pitch of the semiconductor bodies 305. In an embodiment of the present invention, the photolithography process used to define contact openings 360 and 363 is 193 nm. In an embodiment of the present invention, the contact openings 360 and 363 are formed having a width dimension 361 that is approximately equal to the number of semiconductor bodies 305 multiplied by the pitch of the semiconductor bodies 305 and a length 362 approximately equal to the minimum photolithographic feature size. In an embodiment of the present invention, the contact openings 360 and 363 have a width 361 greater than the pitch of the semiconductor bodies 305 but less than the number of semiconductor bodies 305 multiplied by the pitch of the semiconductor bodies 305 and a length 362 on the order of the minimum lithographic feature size. In certain embodiments of the present invention, the contact openings 360 and 363 have a width 361 significantly greater than length 362. In certain embodiments of the present invention, the contact openings 360 and 363 can be imaged as "one-dimensional" slots which can have a length 362 smaller than a length that would be possible if the contact opening was two-dimensional (having a width approximately the same as the length). In other embodiments of the present invention, the dimensions of the contact openings 360 and 363 are not equal.

In an embodiment of the present invention, contact openings 360 and 363 terminate on the source landing pad 318 or drain landing pad 319, respectively. In another embodiment of the present invention, where no source or drain landing pad is used the contact openings 360 and 363 are positioned to expose the plurality of source regions 316 and plurality of drain regions 317 respectively. In certain embodiments of the present invention, the contact openings are etched into ILD 322 with a commonly known anisotropic plasma or reactive ion etching process having sufficient selectivity to the semiconductor source regions 316 and drain regions 317 that the ILD 322 is completely removed to expose the non-planar source regions 316 and non-planar drain regions 317 (or landing pads 318 and 319).

Figure 3L:
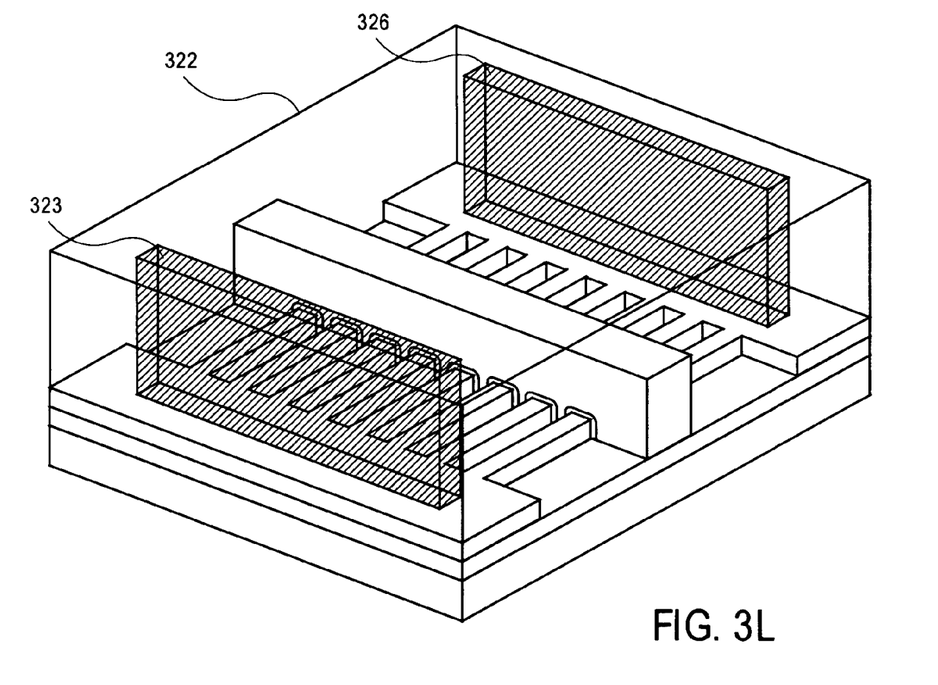

Next the contact openings 360 are filled with metallization to form metal contact structures 323 and 326 as shown in FIG. 3L. The contact structures 323 and 326 can be formed from a commonly known conductive material, such as but not limited to copper, tungsten, aluminum, gold, or carbon nanotubes. The filling of the contact openings 360 is performed by any currently known technique, such as but not limited to physical vapor deposition (PVD), CVD, ALD, electroless or electrolytic plating, or a combination of these techniques. If desired, the method of filling the contact openings 360 can include the deposition of a commonly known barrier layer such as but not limited to tantalum or tantalum nitride, or other intermetallics. If desired, the method of filling the contact openings 360 can include the deposition of a commonly known seed layer such as but not limited to copper, titanium, or other intermetallics.

Next the conductive material used to form the metal contact structures 323 and 326 as shown in FIG. 3L is polished back using commonly known electrolytic, chemical, mechanical removal means, or a combination thereof. In an embodiment of the present invention, a chemical mechanical polish (CMP) process is used in a damascene or dual damascene technique. In this manner, the conductive contact structures can 323 and 326 be planarized to be substantially level with the ILD 322 and subsequently interconnected with additional levels of metallization, if desired.

Thus, a device having a plurality of parallel nanoscale channels with a novel contact architecture and method of fabrication have been described.

We claim:

1. A method of forming a semiconductor device comprising:
   forming a plurality of parallel semiconductor bodies, wherein each of said semiconductor bodies has a channel region between a source region and a drain region;
   forming a single gate electrode over and adjacent to said channel regions of said plurality of parallel semiconductor bodies;
   forming a dielectric layer over said gate electrode and said plurality of parallel semiconductor bodies;
   forming a single drain opening in said dielectric layer which extends between and exposes said drain regions of said plurality of parallel semiconductor bodies;
   forming a single source opening in said dielectric layer which extends between and exposes said source regions of said plurality of parallel semiconductor bodies, wherein forming the single drain opening and single source opening in said dielectric layer further comprises exposing a photoresist mask to approximate one-dimensional slots having a lithographically defined length that is substantially smaller than the lithographically defined width; and
   filling said single drain opening and said single source opening with a metal film wherein said metal film is in contact with said source regions and said drain regions of said plurality of parallel semiconductor bodies.

2. The method of claim 1 wherein said plurality of parallel semiconductor bodies is formed by a method comprising:
   forming a first pattern of parallel features having a first pitch from a first material,
   blanket depositing a conformal film of a second material over and adjacent to said first pattern of parallel features; and
   anisotropically etching said conformal film to form a plurality of parallel spacers from said second material; said plurality of parallel spacers having a second pitch less than said first pitch;
   removing said first pattern of parallel features of said first material and etching a semiconductor film in alignment with said plurality of parallel spacers to form the plurality of parallel semiconductor bodies.

3. The method of claim 2 wherein said first pattern of parallel features are formed by forming a photoresist mask over said first material, and anisotropically etching said first material in alignment with said photoresist mask.

4. The method of claim 3 wherein said photoresist mask is formed by blanket depositing a photoresist film and patterning said photoresist film into a plurality of parallel features having said second pitch which is the smallest pitch which can be defined in said photoresist film utilizing a photolithography process.

5. The method of claim 1 wherein said metal film is blanket deposited into said source opening and said drain opening and onto the top surface of said dielectric layer; and
  polishing back said metal film from the top surface of said dielectric layer to form a single drain contact and a single source contact.

6. The method of claim 5 wherein said metal film is formed in said opening utilizing an electroless or electrolytic deposition process.

7. The method of claim 1, wherein forming a single drain opening in said dielectric layer further comprises exposing a sidewall of said drain regions of said plurality of parallel semiconductor bodies.

8. The method of claim 1, wherein filling said single drain opening with a metal film further comprises depositing a metal on the exposed sidewall of said drain regions of said plurality of parallel semiconductor bodies.

9. A method of forming a semiconductor device comprising:
  forming a plurality of semiconductor bodies in a parallel orientation, wherein each semiconductor body has a channel region between a source region and a drain region;
  forming a single gate electrode over and adjacent to each channel region of the plurality;
  forming a dielectric layer over the gate electrode and plurality of parallel semiconductor bodies;
  forming a first source opening in the dielectric layer exposing a sidewall of at least two of the source regions;
  forming a second source opening in the dielectric layer exposing a sidewall of at least two of the source regions not exposed by the first source opening;
  filling said first source opening with a metal film in contact with the exposed sidewalls to form a first source contact electrically coupling in parallel the at least two source regions exposed by the first source opening;
  filling said second source opening with a metal film in contact with the exposed sidewalls to form a second source contact electrically coupling in parallel the at least two source regions exposed by the second source opening;
  forming a drain opening in said dielectric exposing both the drain region of the semiconductor bodies having source regions electrically coupled to the first source contact and the drain region of the semiconductor bodies having source regions electrically coupled to the second source contact;
  filling said drain opening with a metal film in contact with the exposed drain regions to form a drain contact electrically coupling in parallel the drain regions exposed by the drain opening.

10. The method of claim 9, wherein the drain opening further exposes a sidewall of the drain region of a semiconductor body having a source region not electrically coupled to either the first or second source contact.

11. A method of forming a semiconductor device comprising:
  forming a plurality of semiconductor bodies in a parallel orientation, wherein each semiconductor body has a channel region between a source region and a drain region;
  forming a single gate electrode over and adjacent to each channel region of the plurality;
  forming a dielectric layer over the gate electrode and plurality of parallel semiconductor bodies;
  forming a first drain opening in the dielectric layer exposing a sidewall of at least two of the drain regions;
  forming a second drain opening in the dielectric layer exposing a sidewall of at least two of the drain regions not exposed by the first drain opening;
  filling said first drain opening with a metal film in contact with the exposed sidewalls to form a first drain contact electrically coupling in parallel the at least two drain regions exposed by the first drain opening;
  filling said second drain opening with a metal film in contact with the exposed sidewalls to form a second drain contact electrically coupling in parallel the at least two drain regions exposed by the second drain opening;
  forming a source opening in said dielectric exposing both the source region of the semiconductor bodies having drain regions electrically coupled to the first drain contact and the source region of the semiconductor bodies having drain regions electrically coupled to the second drain contact;
  filling said first source opening with a metal film in contact with the exposed source regions to form a first source contact electrically coupling in parallel the source regions exposed by the source opening.

12. The method of claim 11, wherein the source opening further exposes a sidewall of the source region of a semiconductor body having a drain region not electrically coupled to either the first or second drain contact.

* * * * *